(12) United States Patent
Lee et al.

(10) Patent No.: US 8,174,902 B2
(45) Date of Patent: May 8, 2012

(54) FLASH MEMORY AND A METHOD FOR PROGRAMMING THE FLASH MEMORY IN WHICH A BIT LINE SETUP OPERATION IS EXECUTED SIMULTANEOUSLY WITH A CHANNEL PRE-CHARGE OPERATION

(75) Inventors: Jinwook Lee, Seoul (KR); Jinyub Lee, Seoul (KR); Sangwon Hwang, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 391 days.

(21) Appl. No.: 12/500,867

(22) Filed: Jul. 10, 2009

(65) Prior Publication Data

US 2010/0027332 A1    Feb. 4, 2010

(30) Foreign Application Priority Data

Jul. 30, 2008    (KR) ........................ 10-2008-0074748

(51) Int. Cl.
*G11C 16/06* (2006.01)
(52) U.S. Cl. .......... 365/185.25; 365/185.03; 365/185.19
(58) Field of Classification Search ............ 365/185.03, 365/185.19, 185.25
See application file for complete search history.

(56) References Cited

U.S. PATENT DOCUMENTS 7,697,338 B2 *   4/2010   Hemink ................... 365/185.19

FOREIGN PATENT DOCUMENTS

| JP | 2002-133888 | 5/2002 |
|----|----|----|
| KR | 1020060135099 | 12/2006 |
| KR | 1020070021370 | 2/2007 |
| KR | 100713992 | 4/2007 |

* cited by examiner

Primary Examiner — VanThu Nguyen
(74) Attorney, Agent, or Firm — F. Chau & Associates, LLC

(57) ABSTRACT

A method, device and system are provided for programming a flash memory device, the method including executing a bit line setup operation, and executing a channel pre-charge operation simultaneously with the bit line setup operation, the channel pre-charge operation including applying a channel pre-charge voltage to all word lines; and the device including a voltage generator disposed for providing each of a program voltage, a read voltage, a pass voltage, and a channel pre-charge voltage, a high-voltage switch connected to the voltage generator and disposed for switchably providing one of the program voltage, read voltage, pass voltage, or channel pre-charge voltage, and control logic connected to the high-voltage switch and disposed for simultaneously executing a bit line setup operation and a channel pre-charge operation, the channel pre-charge operation comprising controlling the high-voltage switch to apply the channel pre-charge voltage to both selected and unselected word lines of the device.

25 Claims, 14 Drawing Sheets

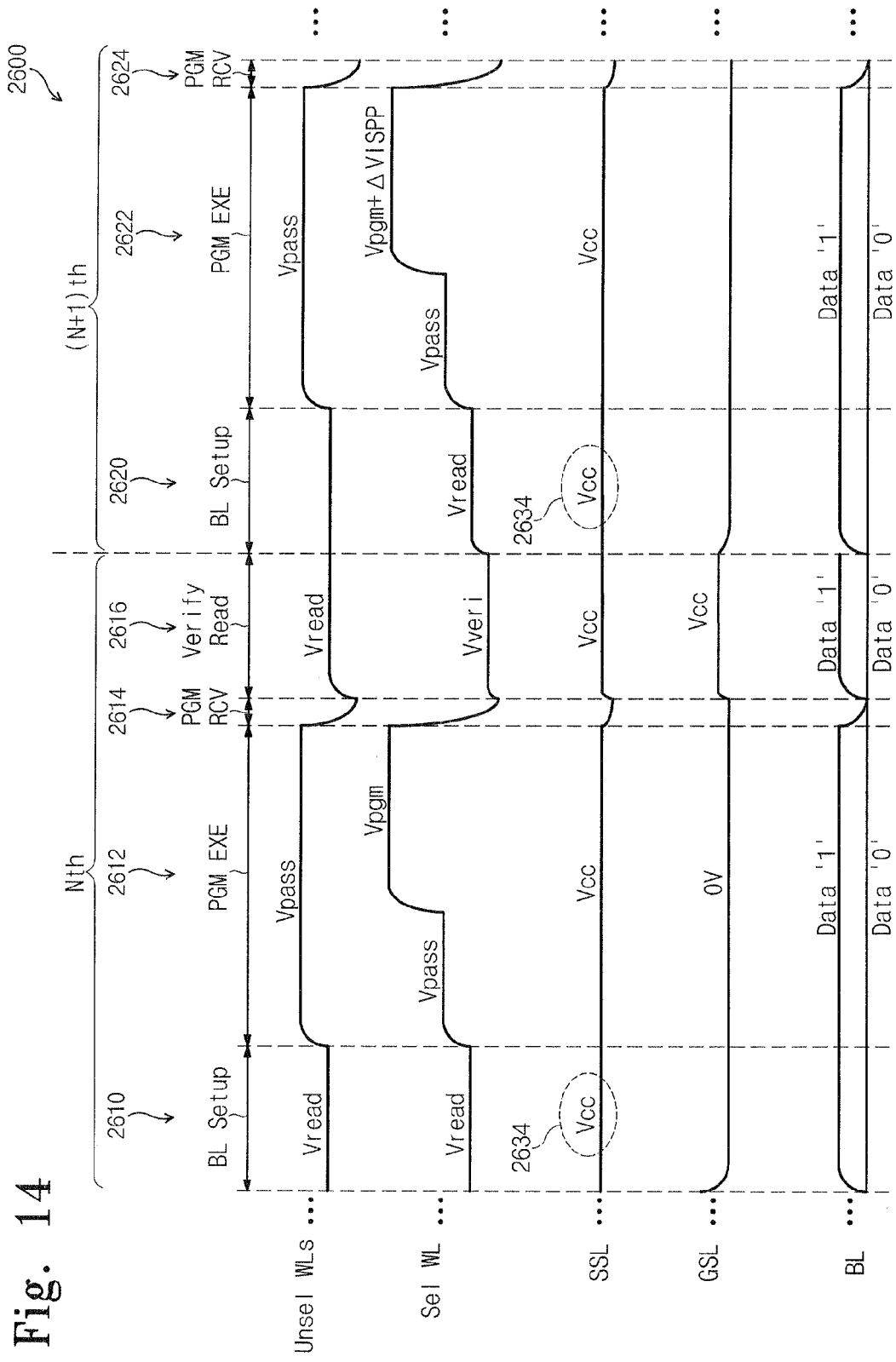

FLASH MEMORY AND A METHOD FOR PROGRAMMING THE FLASH MEMORY IN WHICH A BIT LINE SETUP OPERATION IS EXECUTED SIMULTANEOUSLY WITH A CHANNEL PRE-CHARGE OPERATION

CROSS-REFERENCE TO RELATED APPLICATION

This application claims foreign priority under 35 U.S.C. §119 to Korean Patent Application No. P10-2008-0074748 (Atty. Dkt. ID-200802-009-1), filed on Jul. 30, 2008, in the Korean Intellectual Property Office, the disclosure of which is incorporated by reference herein in its entirety.

BACKGROUND OF THE INVENTION

The present disclosure generally relates to semiconductor memory devices. More particularly, the present disclosure relates to a method and apparatus for fast and efficient programming of flash memory devices.

Flash memories may be used for mass storage and/or executable code memory applications. Mass storage applications generally use NAND types of flash memories. NAND flash memories feature relatively low cost and relatively high density compared to NOR flash memories. In addition, the NAND memories have very good program/erase (P/E) cycling endurance. Thus, NAND flash memories are suitable for use in applications such as memory cards, which may be used in mobile computers, solid-state disks (SSD), which feature rugged and reliable storage, digital cameras, which store still and moving pictures, and voice or audio recorders, which may approach the audio quality of compact disks (CD).

Executable code memory applications generally use NOR types of flash memories. NOR flash memories feature relatively fast random access and execute-in-place (XIP) capabilities compared to NAND flash memories. Thus, NOR flash memories are suitable to use in applications such as basic input/output system (BIOS) for networking, personal computers (PC), routers, hubs, telecommunications switches, cellular telephone code and data, point of sale (POS), personal digital assistant (PDA) and personal communications assistant (PCA) devices, including both code and data.

SUMMARY OF THE INVENTION

These and other issues are addressed by a method and apparatus for efficient programming of flash memory devices. Exemplary embodiments are provided.

An exemplary embodiment method of programming a flash memory device is provided, the method including executing a bit line setup operation and executing a channel pre-charge operation simultaneously with the bit line setup operation, where the channel pre-charge operation includes applying a channel pre-charge voltage to all word lines.

An exemplary embodiment flash memory device is provided, the device including a voltage generator disposed for providing each of a program voltage, a read voltage, a pass voltage, and a channel pre-charge voltage; a high-voltage switch connected to the voltage generator and disposed for switchably providing one of the program voltage, read voltage, pass voltage, or channel pre-charge voltage; and control logic connected to the high-voltage switch and disposed for simultaneously executing a bit line setup operation and a channel pre-charge operation, the channel pre-charge operation comprising controlling the high-voltage switch to apply the channel pre-charge voltage to both selected and unselected word lines of the device.

An exemplary embodiment flash memory system is provided, the system including a flash memory controller; and a flash memory unit connected to the flash memory controller, the flash memory unit including a voltage generator disposed for providing each of a program voltage, a read voltage, a pass voltage, and a channel pre-charge voltage, a high-voltage switch connected to the voltage generator and disposed for switchably providing one of the program voltage, read voltage, pass voltage, or channel pre-charge voltage, and control logic connected to the high-voltage switch and disposed for simultaneously executing a bit line setup operation and a channel pre-charge operation, the channel pre-charge operation comprising controlling the high-voltage switch to apply the channel pre-charge voltage to both selected and unselected word lines of the device.

The present disclosure will be further understood from the following description of exemplary embodiments, which is to be read in connection with the accompanying drawings.

BRIEF DESCRIPTION OF THE DRAWINGS

The present disclosure provides a method and apparatus for efficient programming of flash memory devices in accordance with the following exemplary figures, in which like reference numerals may be used to indicate like elements in the several figures, where:

FIG. 14 shows a schematic timing diagram of yet another ISPP method with simultaneous setup in accordance with an exemplary embodiment of the present disclosure.

DETAILED DESCRIPTION OF PREFERRED EMBODIMENTS

The present disclosure provides a method and apparatus for fast and efficient programming of flash memory devices. Exemplary methods of programming flash memory devices include executing a bit line setup operation, and simultaneously executing a channel pre-charge operation at the same time as the bit line setup operation, where the channel pre-charge operation includes applying a channel pre-charge voltage to all word lines with an X-decoder. Preferably, the channel pre-charge voltage is the minimum voltage required to turn on a plurality of memory cells of the flash memory device. Alternately, the channel pre-charge voltage may be a read voltage greater than or equal to the minimum voltage required to turn on a plurality of memory cells of the flash memory device. The channel pre-charge operation may further include applying the channel pre-charge voltage to a string selection line with the X-decoder.

Figure 1:
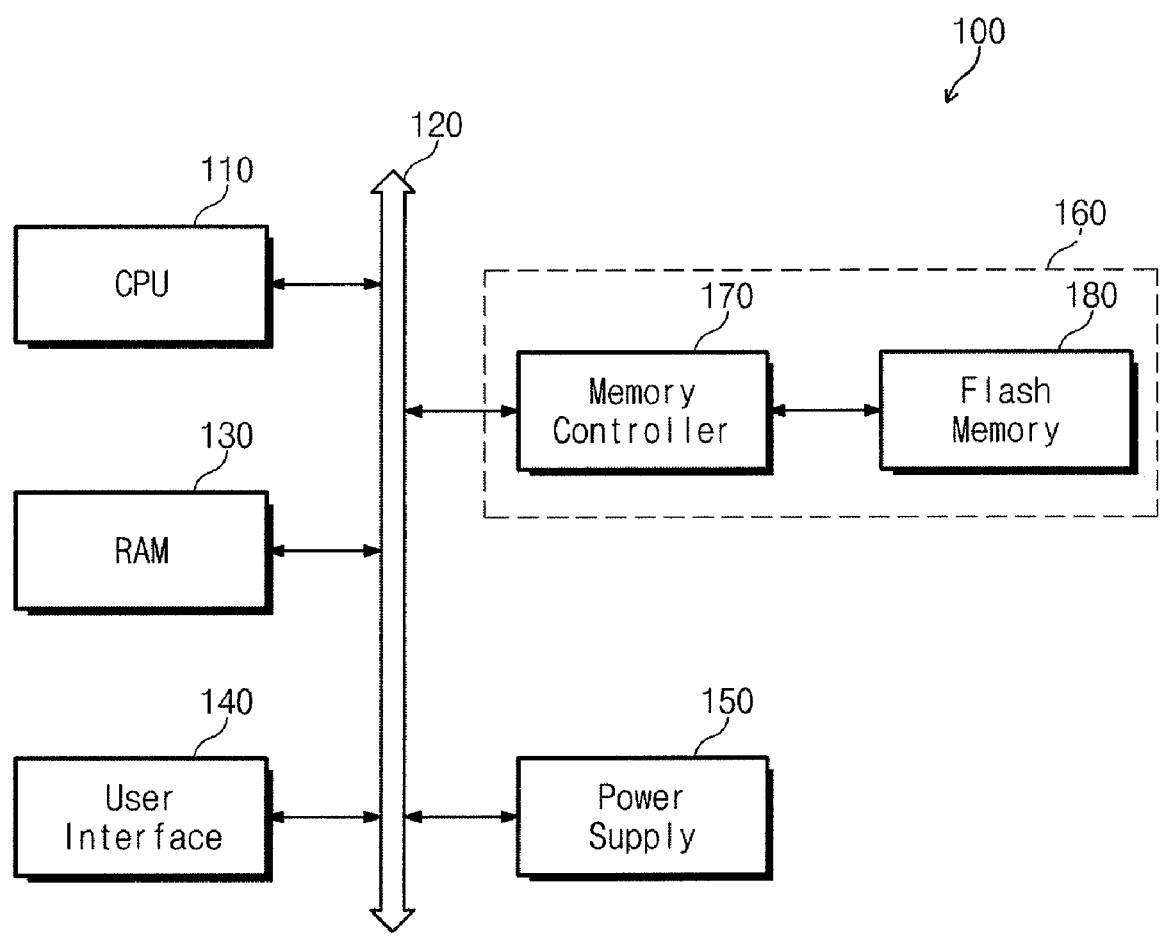
FIG. 1 shows a schematic block diagram for a system with flash memory in accordance with an exemplary embodiment of the present disclosure.

As shown in FIG. 1, a system with flash memory is indicated generally by the reference numeral 100. The system 100 includes a central processing unit (CPU) 110, a bus 120 connected to the CPU, a random access memory (RAM) 130 connected to the bus, a user interface 140 connected to the bus, a power supply 150 connected to the bus, and a flash memory sub-system 160 connected to the bus. The flash memory sub-system 160 includes a memory controller 170 connected to the bus, and a flash memory 180 connected to the controller. Here, the flash memory sub-system 160 may be a flash memory card, solid-state disk (SSD), camera image processing system (CIS) with application chipset, or the like. The flash memory sub-system 160 may be mounted in various package types, such as ball grid arrays (BGA), chip scale packages (CSP), plastic leaded chip carrier (PLCC), plastic dual in-line package (PDIP), multi-chip package (MCP), wafer-level fabricated package (WFP), wafer-level processed stack package (WSP), or the like.

Figure 2:
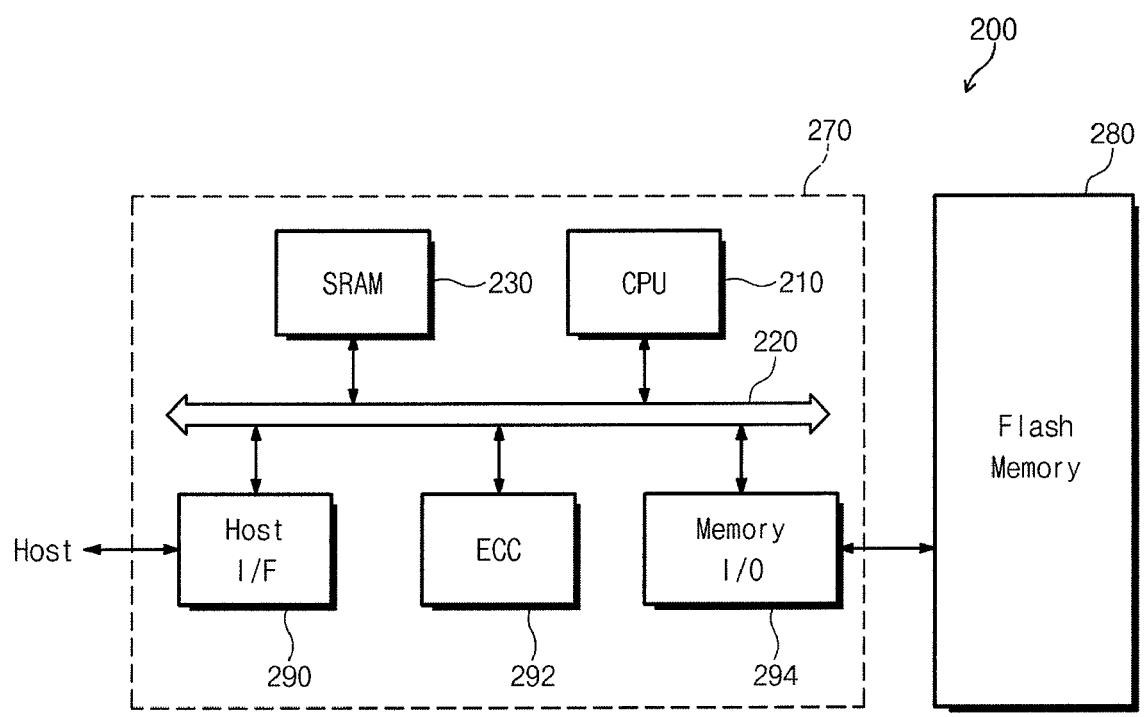
FIG. 2 shows a schematic block diagram for a flash memory card in accordance with an exemplary embodiment of the present disclosure.
Figure 3:
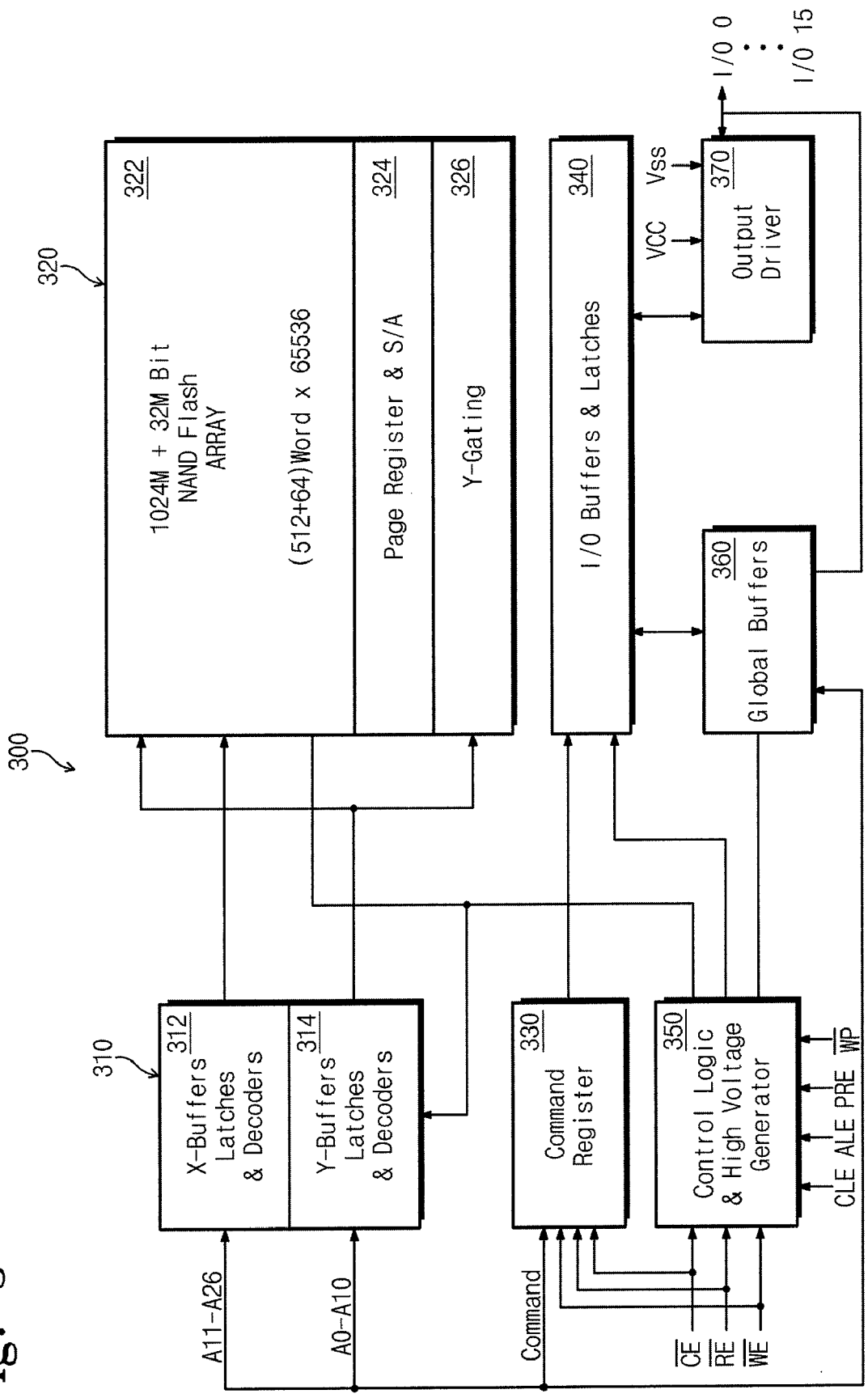
FIG. 3 shows a schematic circuit diagram for a NAND flash memory in accordance with an exemplary embodiment of the present disclosure.

Turning to FIG. 2, a flash memory card is indicated generally by the reference numeral 200. The flash memory card 200 includes a flash memory controller 270 connected to a flash memory 280. The controller 270 controls commands and data between an external host and the flash memory 280. The controller 270 may include an internal CPU 210, an internal bus 220 connected to the internal CPU, an internal static random access memory (SRAM) 230 connected to the internal bus, a host interface module 290 connected between the internal bus and the external host, an error correcting code (ECC) module 292 connected to the internal bus, and a memory interface 294 connected between the internal bus and the flash memory 280. Here, the host interface module 290 of the memory controller 270 may be connected to an external device or host using a protocol such as Universal Serial Bus (USB), MultiMedia Card (MMC), Peripheral Component Interconnect Express (PCI-E), Serial Advanced Technology Attachment (SATA), Parallel Advanced Technology Attachment (PATA), Small Computer Serial Interface (SCSI), Enhanced Small-Device Interface (ESDI) or Integrated Drive Electronics (IDE). Turning now to FIG. 3, a NAND flash memory system is indicated generally by the reference numeral 300. The NAND memory 300 includes a decoding unit 310 connected to a memory array 320; a command register 330 connected to an input/output (I/O) unit 340, which includes I/O buffers and latches; a control unit 350, which includes control logic and a high-voltage generator, connected to the array 320, the I/O unit 340, and the global buffers 360, which, in turn, are connected to the I/O unit 340; and an output driver 370 connected to the I/O unit 340 and the global buffers 360.

The decoding unit 310 includes an X portion 312 for receiving high-order address bits A26-A11, the X portion 312 having X-buffers, X-latches and X-decoders connected to the array 320; and a Y portion 314 for receiving low-order address bits A10-A0, the Y portion 314 having Y-buffers, Y-latches and Y-decoders connected to the control unit 350 and the array 320.

The array 320 includes a 1024M+32M bit NAND flash array portion 322 having a size of (512+64)Word times 65536, a page register and sense amplifier (S/A) portion 324, and a Y-gating portion 326, which is connected to the Y portion 314 of the decoding unit 310 and to the I/O unit 340.

Figure 4:
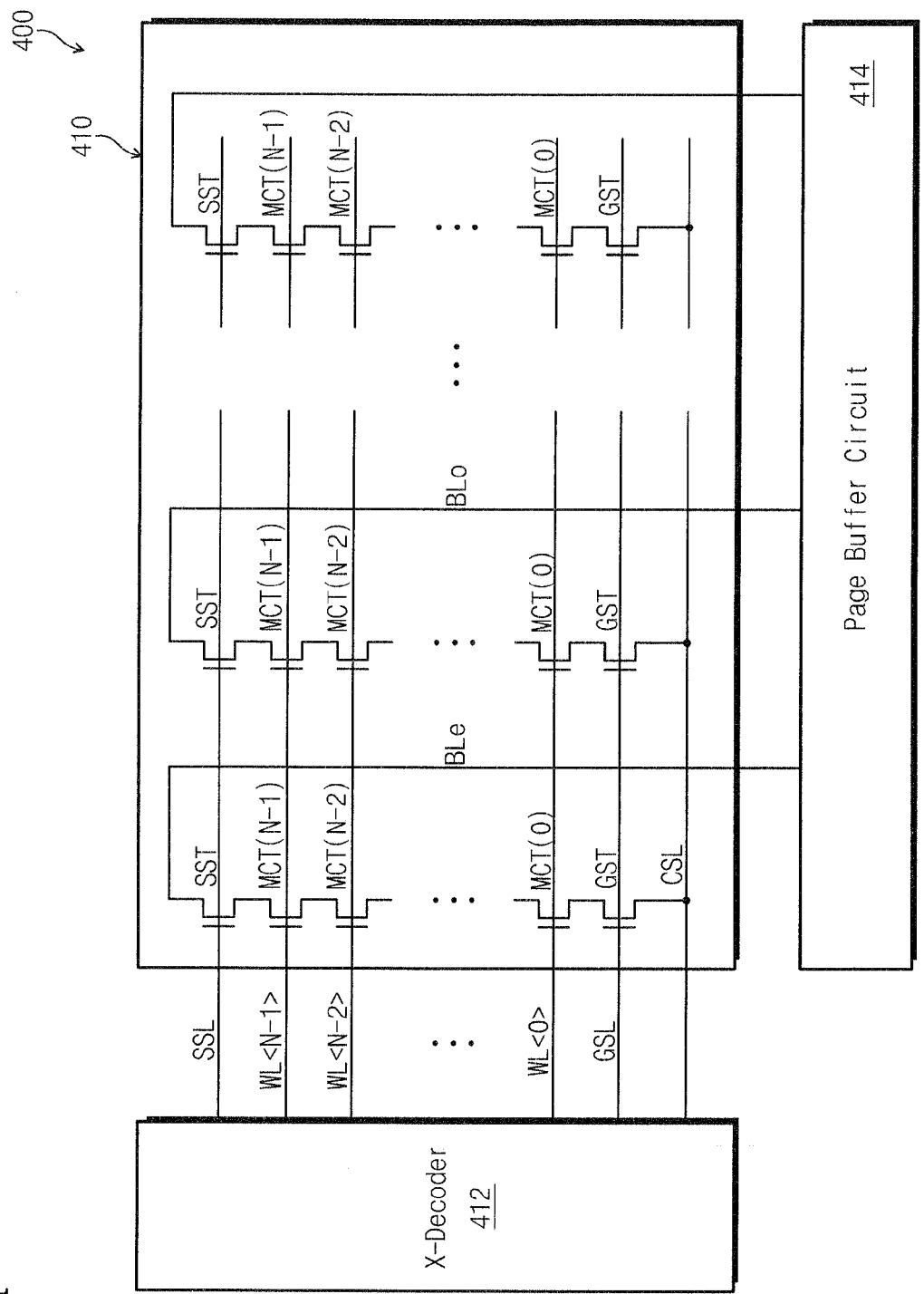
FIG. 4 shows a schematic circuit diagram for a block of NAND Flash memory in accordance with an exemplary embodiment of the present disclosure.

As shown in FIG. 4, a block of NAND Flash memory is indicated generally by the reference numeral 400. The block 400 includes an array 410, an X-decoder 412 connected to the array, and a page buffer circuit 414 connected to the array. The array 410 includes a plurality of floating-gate transistors connected to a word line (WL), a bit line (BL), a string selection line (SSL), a ground source line (GSL), a common source line (CSL), a string selection transistor (SST), a ground selection TR (GST), and a memory cell transistor (MCT). Here, the X-decoder 412 controls voltages of lines WL, SSL and GSL, while the page buffer circuit 414 controls voltages of bit lines BLe and BLo. Thus, the X-decoder may have So input and WLo output.

Figure 5:
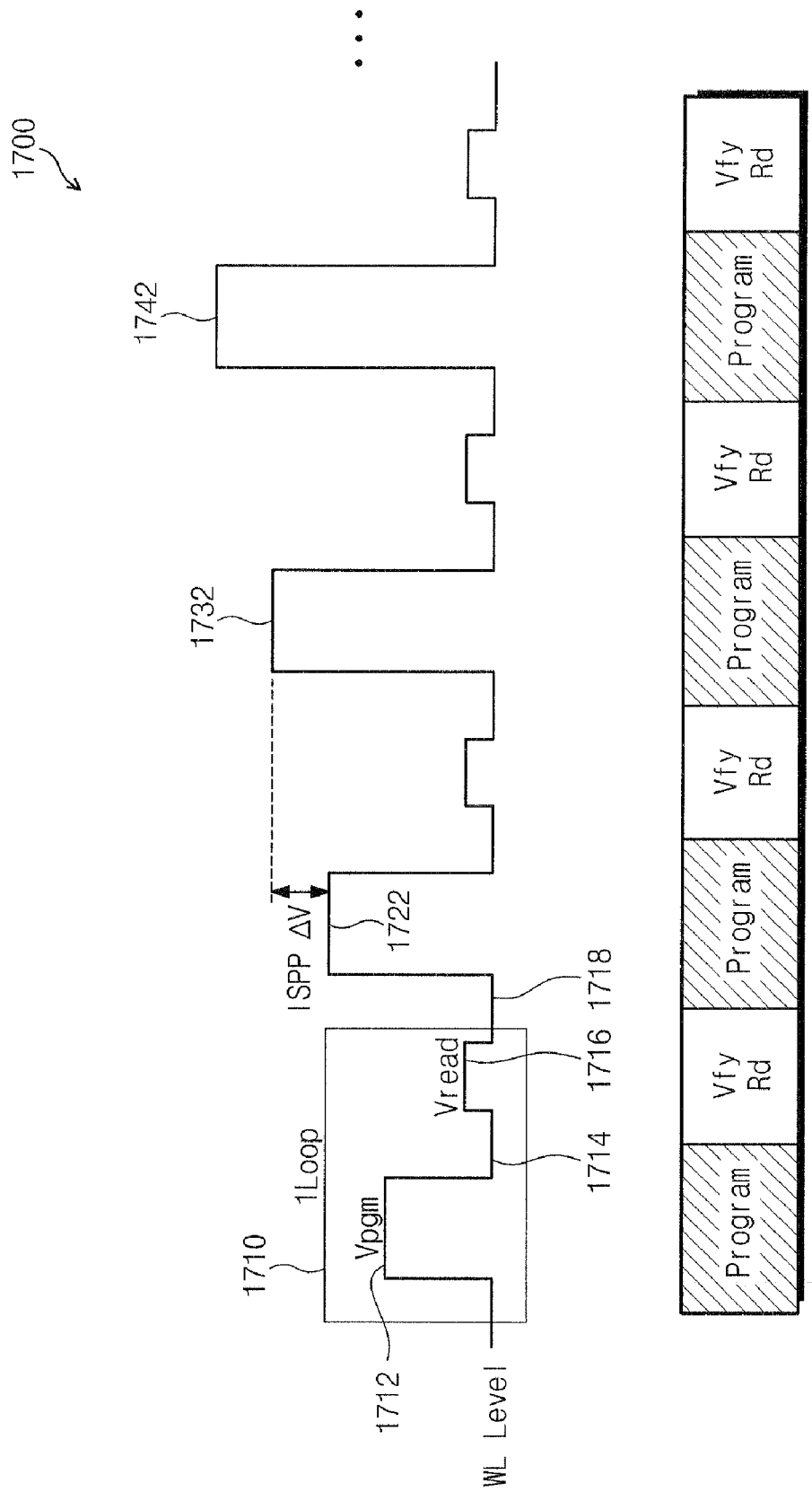
FIG. 5 shows a schematic timing diagram of applied word line voltage potential for an incremental step pulse programming (ISPP) method in accordance with an exemplary embodiment of the present disclosure.

Turning to FIG. 5, the applied word line voltage potential for a generalized incremental step pulse programming (ISPP) method is indicated generally by the reference numeral 1700. Here, a first loop 1710 includes a first program (PGM) interval 1712, where a first PGM voltage Vpgm is applied for the PGM interval, followed by a first transition interval 1714, which, in turn, is followed by a verify read interval 1716, where the read voltage Vread is applied, and then a second transition interval 1718. Next, the PGM voltage Vpgm is increased by an ISPP delta V amount, and the loop is repeated with the increased Vpgm applied for the next PGM interval 1722. The PGM voltage Vpgm is increased again for each subsequent loop 1732 and 1742, respectively, until the PGM voltage reaches its maximum limit.

Each programming unit loop includes a program operation step and a verify read operation step. In the program operation step, the program voltage Vpgm is applied to the selected word line and a pass voltage Vpass is applied to unselected word lines. In the verify read operation steps, a verify voltage Vvfy is applied to the selected word line and a read voltage Vread is applied to unselected word lines. Here, the program voltage Vpgm increases by the amount of delta voltage $\Delta V$ per unit program loop.

Figure 6:
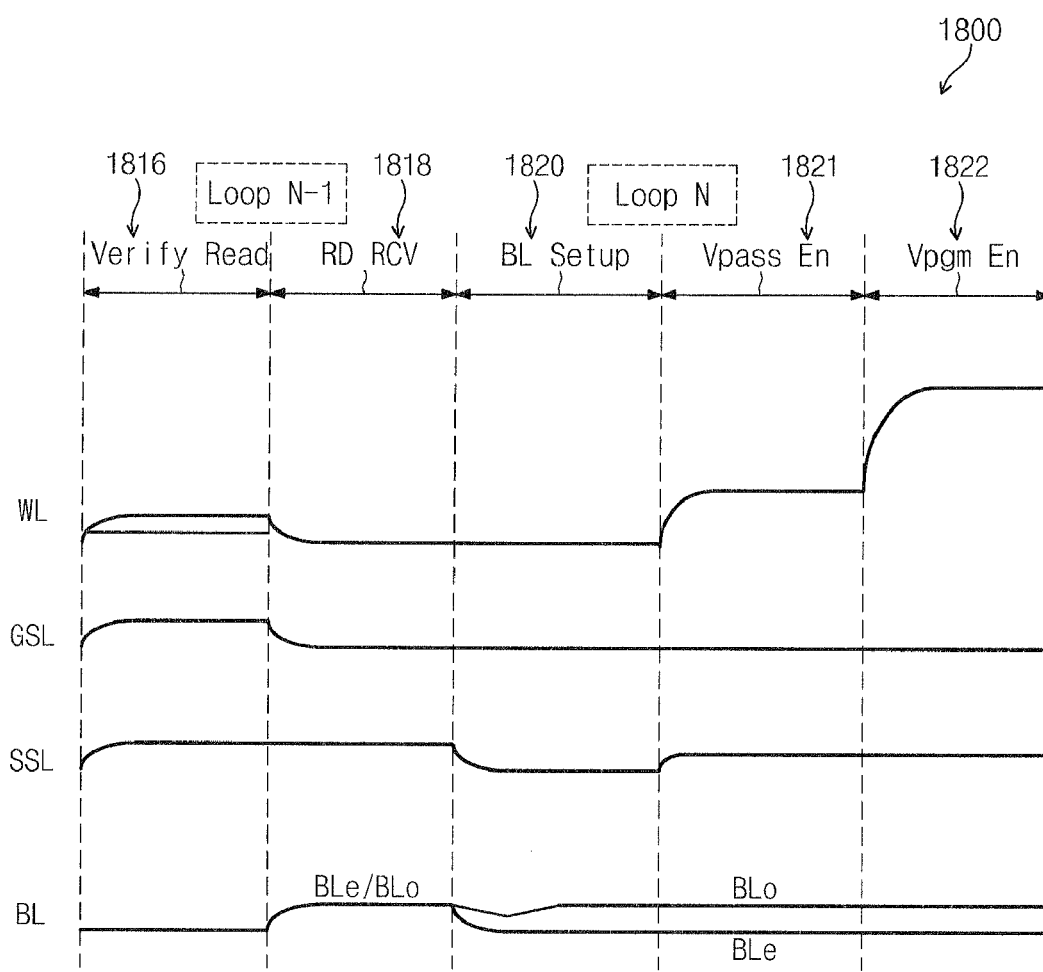
FIG. 6 shows a schematic timing diagram of an ISPP method in accordance with an exemplary embodiment of the present disclosure.

Turning now to FIG. 6, a timing diagram for the generalized incremental step pulse programming (ISPP) method is indicated generally by the reference numeral 1800. In the diagram 1800, a preceding loop N−1 includes a verify read interval 1816 followed by a read recovery interval 1818. A following loop N includes a bit line setup interval 1820, followed by a Vpass enable interval 1821, which, in turn, is followed by a Vpgm enable interval 1822 and a program recovery interval.

In the verify read interval 1816, the word line (WL), ground source line (GSL) and string selection line (SSL) transition to Vread, and the bit lines (BL) BLo and BLe stay low. In the read recovery interval 1818, the WL and GSL transition to low, the SSL remains at Vread, and the bit lines BLo and BLe transition high. In the BL setup interval 1820, the WL and GSL remain low, the SSL transitions to low, the BLo stays high, and the BLe transitions to low. In the Vpass enable interval 1821, the WL transitions to Vpass, the GSL remains low, the SSL transitions to Vcc, the BLo remains high and the BLe remains low. In the Vpgm enable interval 1822, the WL transitions to Vpgm, the GSL remains low, the SSL remains at Vcc, the BLo remains high, and the BLe remains low. Thus, in this example, the bit line setup operation is executed after the read recovery operation.

Figure 7:
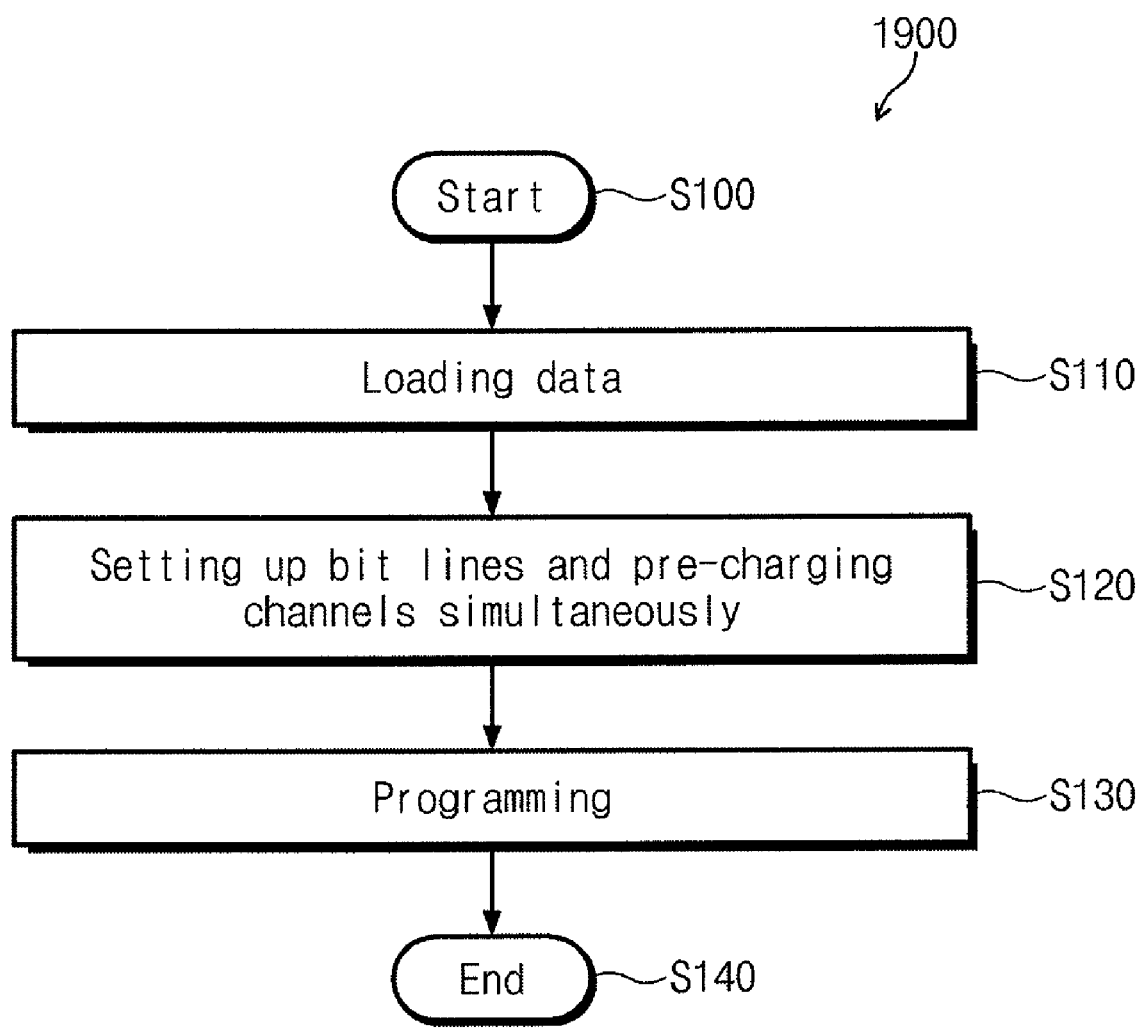
FIG. 7 shows a schematic flow diagram for a program method with simultaneous setup in accordance with an exemplary embodiment of the present disclosure.

As shown in FIG. 7, a program method with simultaneous setup is indicated generally by the reference numeral 1900. The program method 1900 includes a start block S100, which passes control to a data loading block S110. The data loading block passes control to a single setup block S120, which sets up bit lines while simultaneously pre-charging channels. The single setup block, in turn, passes control to a programming block S130, which passes control to an end block S140. Here, the bit line setup operation is based on the loading data of the page buffer. Thus, the present method executes the bit line setup and channel pre-charge operations simultaneously. This method features increased self-boosting efficiency and reduced program time over the method 1700 and timing 1800 of FIGS. 5 and 6, respectively.

Figure 8:
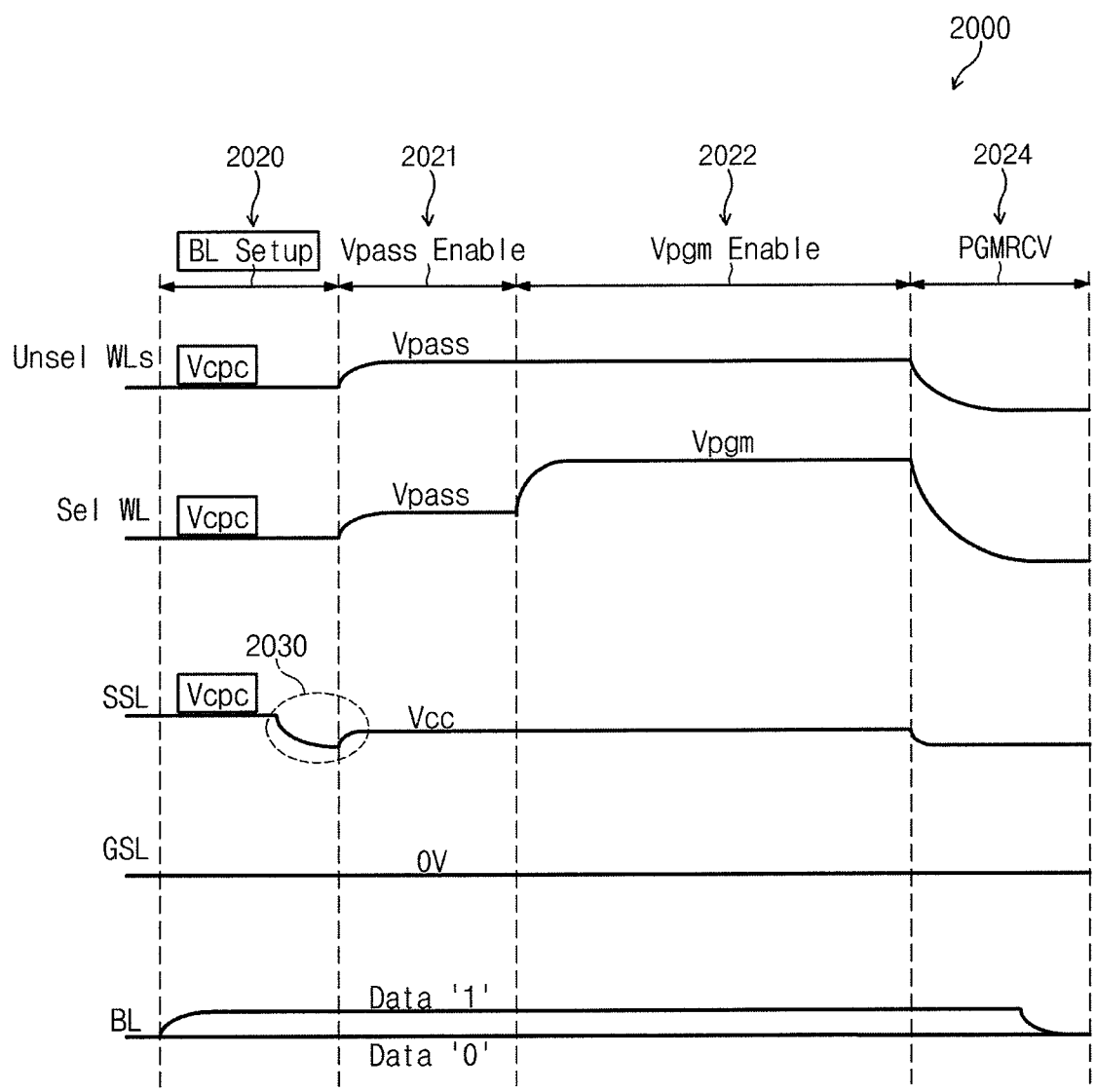
FIG. 8 shows a schematic timing diagram of a program method with simultaneous setup in accordance with an exemplary embodiment of the present disclosure.

Turning to FIG. 8, a first example program signal timing diagram for a program method with simultaneous setup is indicated generally by the reference numeral 2000. In the timing diagram 2000, a program loop includes a bit line setup interval 2020, followed by a Vpass enable interval 2021, followed by a Vpgm enable interval 2022, which, in turn, is followed by a program recovery interval 2024.

In the BL setup interval 2020, the unselected WLs remain at a channel pre-charge voltage Vcpc, the selected WL remains at the Vcpc, the SSL transitions from Vcpc to low, the GSL remains low at 0 V, the BLs transition high for data "1", and stay low for data "0". In the Vpass enable interval 2021, the unselected WLs transition to a pass voltage Vpass, the selected WL transitions to Vpass, the SSL transitions up to Vcc, the GSL remains low, the data "1" BLs remain high and the data "0" BLs remain low. In the Vpgm enable interval 2022, the unselected WLs remain at Vpass, the selected WL transitions up to Vpgm, the SSL remains at Vcc, the GSL remains low, the data "1" BLs remain high and the data "0" BLs remain low. In the program recovery interval 2024, the unselected WLs transition low, the selected WL transitions low, the SSL transitions low, the GSL remains low, the data "1" BLs transition low, and the data "0" BLs remain low. A verify read interval follows the program recovery interval. Thus, in this example, the bit line setup operation is executed simultaneously with the channel pre-charge operation.

Here, Vcpc is greater than GND potential. It is preferable that Vcpc be less than Vread to increase efficiency. Although the verify read interval is not shown, it shall be understood that a read recovery interval is not always necessary.

In operation, the program loop is composed of the bit line setup, the Vpass voltage enable, the Vpgm voltage enable, the program recovery operation, and the verify read operation. During the bit line setup operation, the channel pre-charge operation is also executed. The channel pre-charge voltage Vcpc is applied to a selected word line, to the unselected word lines, and to the SSL. Here, Vcpc may be the minimum voltage needed to turn on the memory cells and SST. A ground (GND) voltage is applied to the SSL between applying the Vcpc and applying the Vcc. Thus, the SSL transitions from Vcpc down to 0 V and then up to Vcc in a hybrid interval 2030.

Figure 9:
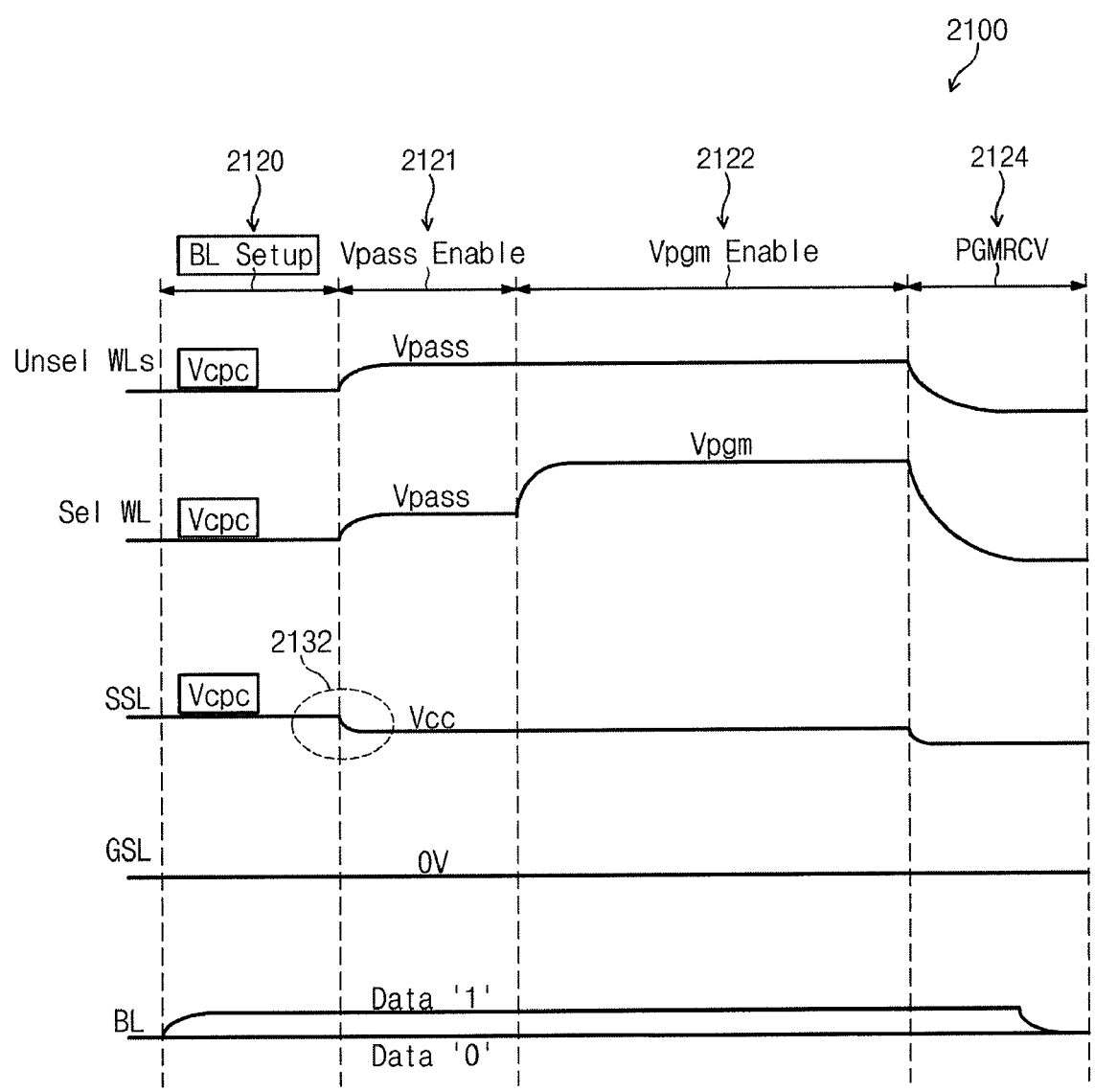
FIG. 9 shows a schematic timing diagram of another program method with simultaneous setup in accordance with an exemplary embodiment of the present disclosure.

Turning now to FIG. 9, a second example program signal timing diagram for a program method with simultaneous setup is indicated generally by the reference numeral 2100. In the timing diagram 2100, a program loop includes a bit line setup interval 2120, followed by a Vpass enable interval 2121, followed by a Vpgm enable interval 2122, which, in turn, is followed by a program recovery interval 2124.

In the BL setup interval 2120, the unselected WLs remain at a channel pre-charge voltage Vcpc, the selected WL remains at the Vcpc, the SSL remains at Vcpc, the GSL remains low at 0 V, the BLs transition high for data "1", and stay low for data "0". In the Vpass enable interval 2121, the unselected WLs transition to a pass voltage Vpass, the selected WL transitions to Vpass, the SSL transitions down to Vcc, the GSL remains low, the data "1" BLs remain high and the data "0" BLs remain low. In the Vpgm enable interval 2122, the unselected WLs remain at Vpass, the selected WL transitions up to Vpgm, the SSL remains at Vcc, the GSL remains low, the data "1" BLs remain high and the data "0" BLs remain low. In the program recovery interval 2124, the unselected WLs transition low, the selected WL transitions low, the SSL transitions low, the GSL remains low, the data "1" BLs transition low, and the data "0" BLs remain low. A verify read interval follows the program recovery interval. Thus, in this second simultaneous setup example, the bit line setup operation is also executed simultaneously with the channel pre-charge operation.

In operation, the program loop is composed of the bit line setup, the Vpass voltage enable, the Vpgm voltage enable, the program recovery operation, and the verify read operation. During the bit line setup operation, the channel pre-charge operation is also executed. The channel pre-charge voltage Vcpc is applied to a selected word line, to the unselected word lines, and to the SSL. Vcpc may be the minimum voltage needed to turn on the memory cells and SST. Here, Vcc is applied to SSL after applying Vcpc without applying any GND voltage. Thus, the SSL transitions from Vcpc down to Vcc in a hybrid interval 2132.

Figure 10:
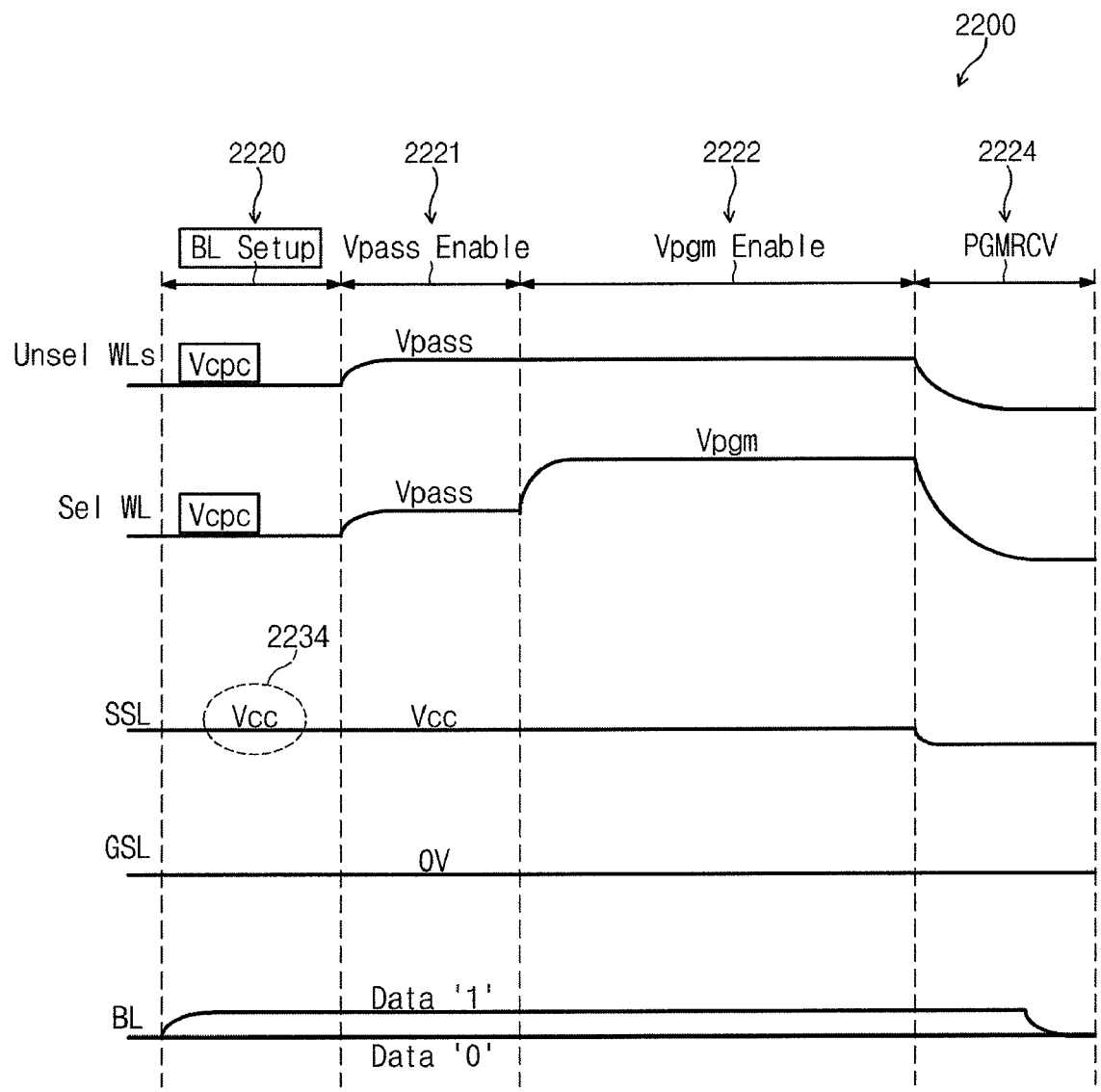
FIG. 10 shows a schematic timing diagram of yet another program method with simultaneous setup in accordance with an exemplary embodiment of the present disclosure.

As shown in FIG. 10, a third example program signal timing diagram for a program method with simultaneous setup is indicated generally by the reference numeral 2200. In the timing diagram 2200, a program loop includes a bit line setup interval 2220, followed by a Vpass enable interval 2221, followed by a Vpgm enable interval 2222, which, in turn, is followed by a program recovery interval 2224.

In the BL setup interval 2220, the unselected WLs remain at a channel pre-charge voltage Vcpc, the selected WL remains at the Vcpc, the SSL remains at Vcc, the GSL remains low at 0 V, the BLs transition high for data "1", and stay low for data "0". In the Vpass enable interval 2221, the unselected WLs transition to a pass voltage Vpass, the selected WL transitions to Vpass, the SSL remains at Vcc, the GSL remains low, the data "1" BLs remain high and the data "0" BLs remain low. In the Vpgm enable interval 2222, the unselected WLs remain at Vpass, the selected WL transitions up to Vpgm, the SSL remains at Vcc, the GSL remains low, the data "1" BLs remain high and the data "0" BLs remain low. In the program recovery interval 2224, the unselected WLs transition low, the selected WL transitions low, the SSL transitions low, the GSL remains low, the data "1" BLs transition low, and the data "0" BLs remain low. A verify read interval follows the program recovery interval. Thus, in this second simultaneous setup example, the bit line setup operation is also executed simultaneously with the channel pre-charge operation.

In operation, the program loop is composed of the bit line setup, the Vpass voltage enable, the Vpgm voltage enable, the program recovery operation, and the verify read operation. During the bit line setup operation, the channel pre-charge operation is also executed. The channel pre-charge voltage Vcpc is applied to a selected word line, and to the unselected word lines. Vcpc may be the minimum voltage needed to turn on the memory cells and SST. Here, Vcc is applied to SSL without applying Vcpc during the bit line setup operation. Thus, the SSL remains at Vcc in a hybrid interval 2234.

Figure 11:
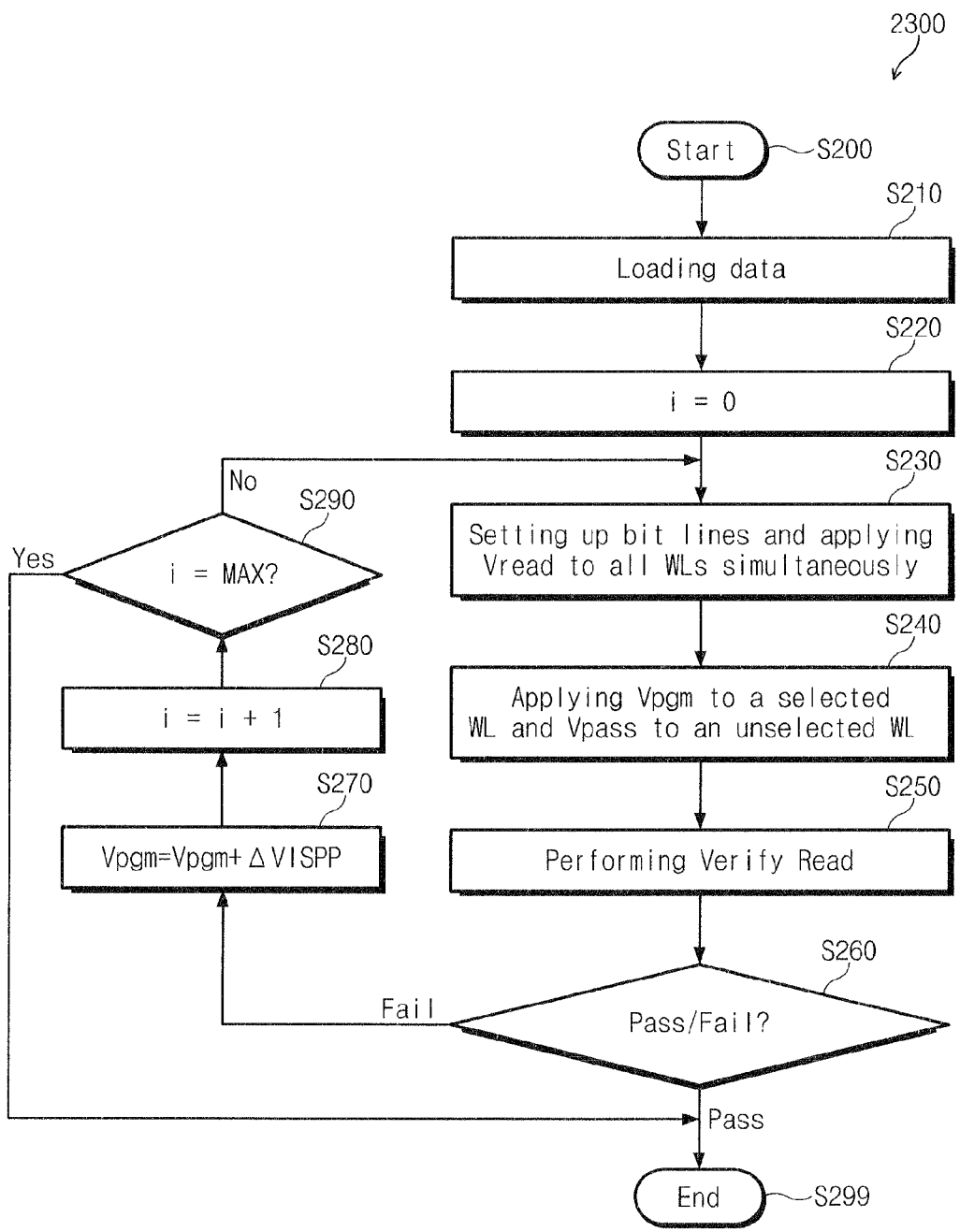
FIG. 11 shows a schematic flow diagram for an incremental step pulse programming (ISPP) method with simultaneous setup in accordance with an exemplary embodiment of the present disclosure.

Turning now to FIG. 11, an incremental step pulse programming (ISPP) method with simultaneous setup is indicated generally by the reference numeral 2300. The method 2300 includes a start block S200 that passes control to a data loading block S210. The block S210 passes control to a loop counter initialization block S220, which initializes a loop counter i to 0, and passes control to a simultaneous setup block S230. The block S230 sets up bit lines and simultaneously applies Vread to all word lines. The block S230 passes control to a block S240, which applies Vpgm to a selected word line and applies Vpass to unselected word lines. The block S240, in turn, passes control to a block S250, which performs a verify read operation and passes control to a decision block S260. The decision block S260 determines whether the memory cell passed or failed the verification, and if it passed, passes control to an end block S299.

On the other hand, if the memory cell failed the verification, the block S260 passes control to a function block S270 that increments the program voltage Vpgm by a delta ISPP voltage increment ΔVispp per unit program loop. The block S270, in turn, passes control to a function block S280, which increments the program loop counter i by one, and passes control to a decision block S290. The block S290 determines whether the program counter i has reached its maximum limit, and if so, passes control to the end block S299. On the other hand, if the program counter i has not yet reached its maximum limit, control is passed back to the function block S230 for setting up bit lines and simultaneously applying Vread to all word lines.

In operation, the channel pre-charge operation is executed during the bit line setup operation at the function block S230. Vread is applied to both the selected word line and the unselected word lines. In alternate embodiments, Vcpc may also be applied to the selected word line or unselected word lines. At the verify read step S250, Vread is applied to unselected word lines and Vverify is applied to the selected word line.

Figure 12:
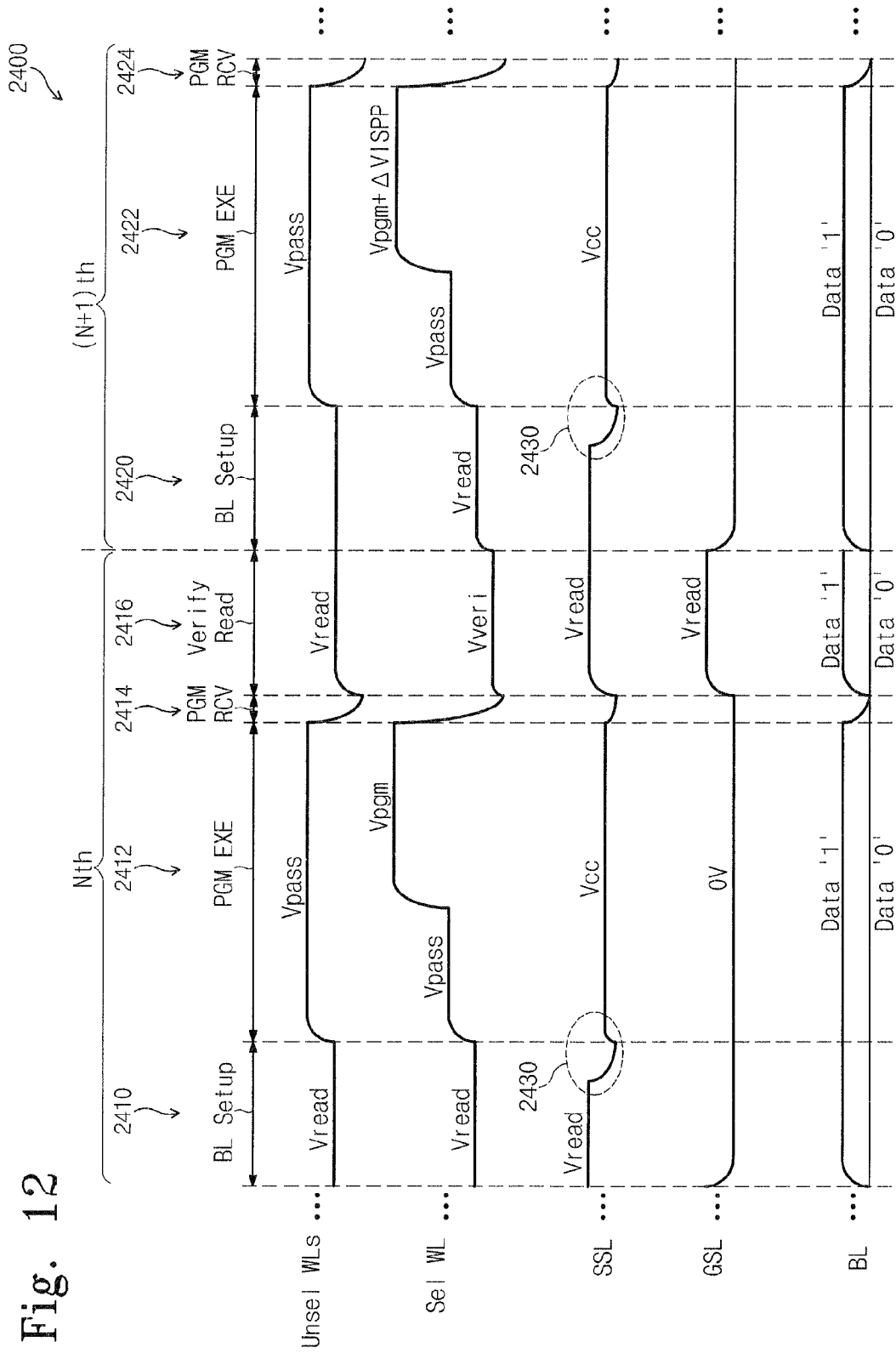
FIG. 12 shows a schematic timing diagram of an ISPP method with simultaneous setup in accordance with an exemplary embodiment of the present disclosure.

Turning now to FIG. 12, a first example program signal timing diagram for an ISPP method with simultaneous setup is indicated generally by the reference numeral 2400. In the timing diagram 2400, a preceding Nth program loop includes a bit line setup interval 2410, followed by a program execute interval 2412, followed by a program recovery interval 2414, which, in turn, is followed by a verify read interval 2416. In addition, a following (N+1)th program loop includes a bit line setup interval 2420, followed by a program execute interval 2422, followed by a program recovery interval 2424, which, in turn, is followed by a verify read interval.

In the BL setup interval 2410, the unselected WLs remain at a read voltage Vread, the selected WL remains at Vread, the SSL transitions from Vread to low or 0 V towards the end of the interval, the GSL transitions from Vread to low or 0 V towards the beginning of the interval, the BLs transition high for data "1" towards the beginning of the interval, and stay low for data "0". In the relatively long program execute interval 2412, the unselected WLs transition to a pass voltage Vpass towards the beginning of the interval, the selected WL transitions to Vpass towards the beginning of the interval and then transition to Vpgm towards the end of the interval, the SSL transitions up to Vcc towards the beginning of the interval, the GSL remains low, the data "1" BLs remain high and the data "0" BLs remain low. In the relatively short program recovery interval 2414, the unselected WLs transition low to 0 V, the selected WL transitions low to 0 V, the SSL transitions low to 0 V, the GSL remains low at 0 V, the data "1" BLs transition low to 0 V, and the data "0" BLs remain low at 0 V. A verify read interval 2416 follows the program recovery interval. In the verify read interval, the unselected WLs transition up to Vread, the selected WL transitions up to Vverify, the SSL transitions up to Vread, the GSL transitions up to Vread, the data "1" BLs transition high, and the data "0" BLs remain low at 0 V.

The bit line setup operation is executed simultaneously with the channel pre-charge operation in the bit line setup interval. In the following (N+1)th program loop, the bit line setup, program recovery and verify read intervals 2420, 2424 and 2426, respectively, are substantially the same as the Nth intervals 2410, 2414 and 2416, respectively, so duplicate description may be omitted. The (N+1)th program execute interval 2422 differs from the Nth program execute interval in that the voltage Vpgm+ΔVispp is applied to the selected word line towards the end of the interval instead of the voltage Vpgm. Subsequent (N+M)th program execute intervals differ from the Nth program execute interval in that the voltage Vpgm+MΔVispp is applied to the selected word line towards the end of the interval instead of the voltage Vpgm. In the Nth and subsequent program loops, a hybrid interval 2430 highlights the transitions of SSL from Vread to 0 V towards the end of the bit line setup interval, and from 0 V to Vcc towards the beginning of the program execute interval. Thus, the SSL transitions from Vread down to 0 V or GND and then up to Vcc in a hybrid interval 2430. In alternate embodiments, the SSL may transition from Vcpc to GND and then to Vcc in a hybrid interval.

Figure 13:
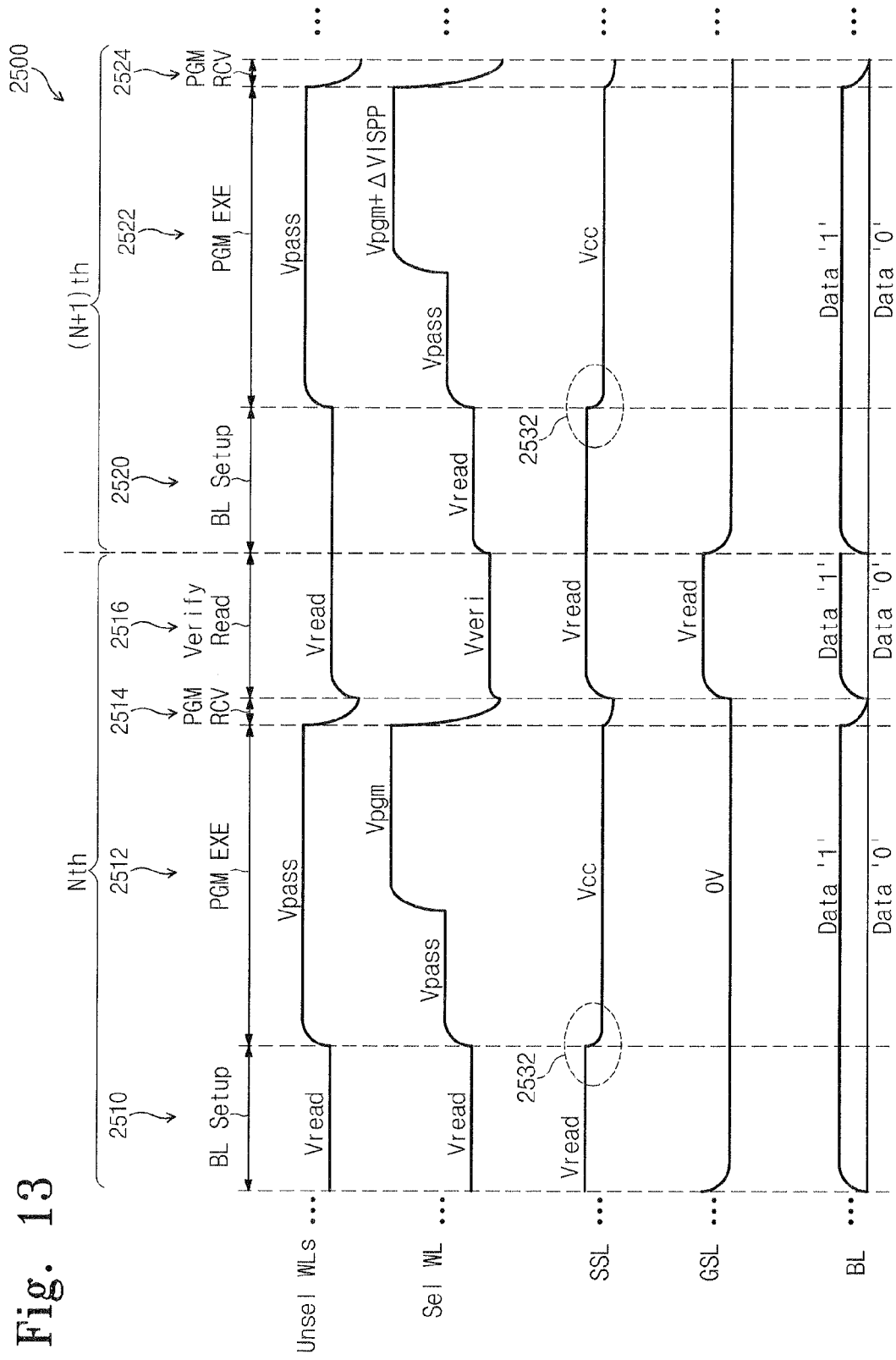
FIG. 13 shows a schematic timing diagram of another ISPP method with simultaneous setup in accordance with an exemplary embodiment of the present disclosure.

As shown in FIG. 13, a second example program signal timing diagram for an ISPP method with simultaneous setup is indicated generally by the reference numeral 2500. In the timing diagram 2500, a preceding Nth program loop includes a bit line setup interval 2510, followed by a program execute interval 2512, followed by a program recovery interval 2514, which, in turn, is followed by a verify read interval 2516. In addition, a following (N+1)th program loop includes a bit line setup interval 2520, followed by a program execute interval 2522, followed by a program recovery interval 2524, which, in turn, is followed by a verify read interval.

In the BL setup interval 2510, the unselected WLs remain at a read voltage Vread, the selected WL remains at Vread, the SSL remains at Vread, the GSL transitions from Vread to low or 0 V towards the beginning of the interval, the BLs transition high for data "1" towards the beginning of the interval, and stay low for data "0". In the relatively long program execute interval 2512, the unselected WLs transition to a pass voltage Vpass towards the beginning of the interval, the selected WL transitions to Vpass towards the beginning of the interval and then transition to Vpgm towards the end of the interval, the SSL transitions down to Vcc towards the beginning of the interval, the GSL remains low, the data "1" BLs remain high and the data "0" BLs remain low. In the relatively short program recovery interval 2514, the unselected WLs transition low to 0 V, the selected WL transitions low to 0 V, the SSL transitions low to 0 V, the GSL remains low at 0 V, the data "1" BLs transition low to 0 V, and the data "0" BLs remain low at 0 V. A verify read interval 2516 follows the program recovery interval. In the verify read interval, the unselected WLs transition up to Vread, the selected WL transitions up to Vverify, the SSL transitions up to Vread, the GSL transitions up to Vread, the data "1" BLs transition high, and the data "0" BLs remain low at 0 V. Thus, Vcc is applied to SSL after applying Vread without applying GND in between.

The bit line setup operation is executed simultaneously with the channel pre-charge operation in the bit line setup interval. In the following (N+1)th program loop, the bit line setup, program recovery and verify read intervals 2520, 2524 and 2526, respectively, are substantially the same as the Nth intervals 2510, 2514 and 2516, respectively, so duplicate description may be omitted. The (N+1)th program execute interval 2522 differs from the Nth program execute interval in that the voltage Vpgm+ΔVispp is applied to the selected word line towards the end of the interval instead of the voltage Vpgm. Subsequent (N+M)th program execute intervals differ from the Nth program execute interval in that the voltage Vpgm+MΔVispp is applied to the selected word line towards the end of the interval instead of the voltage Vpgm. In the Nth and subsequent program loops, a hybrid interval 2532 highlights the transitions of SSL from Vread to Vcc towards the beginning of the program execute interval. Thus, the SSL transitions from Vread down to Vcc in the hybrid interval 2532. In alternate embodiments, the SSL may transition from Vcpc to Vcc in a hybrid interval.

Turning to FIG. 14, a third example program signal timing diagram for an ISPP method with simultaneous setup is indicated generally by the reference numeral 2600. In the timing diagram 2600, a preceding Nth program loop includes a bit line setup interval 2610, followed by a program execute interval 2612, followed by a program recovery interval 2614, which, in turn, is followed by a verify read interval 2616. In addition, a following (N+1)th program loop includes a bit line setup interval 2620, followed by a program execute interval 2622, followed by a program recovery interval 2624, which, in turn, is followed by a verify read interval.

In the BL setup interval 2610, the unselected WLs remain at a read voltage Vread, the selected WL remains at Vread, the SSL remains at Vcc, the GSL transitions from Vcc to low or 0 V towards the beginning of the interval, the BLs transition high for data "1" towards the beginning of the interval, and stay low for data "0". In the relatively long program execute interval 2612, the unselected WLs transition to a pass voltage Vpass towards the beginning of the interval, the selected WL transitions to Vpass towards the beginning of the interval and then transition to Vpgm towards the end of the interval, the SSL transitions remains at Vcc, the GSL remains low, the data "1" BLs remain high and the data "0" BLs remain low. In the relatively short program recovery interval 2614, the unselected WLs transition low to 0 V, the selected WL transitions low to 0 V, the SSL transitions low to 0 V, the GSL remains low at 0 V, the data "1" BLs transition low to 0 V, and the data "0" BLs remain low at 0 V. A verify read interval 2616 follows the program recovery interval. In the verify read interval, the unselected WLs transition up to Vread, the selected WL transitions up to Vverify, the SSL transitions up to Vcc, the GSL transitions up to Vcc, the data "1" BLs transition high, and the data "0" BLs remain low at 0 V. Thus, SSL and GSL have Vcc and GND applied, but not Vread. That is, Vcc is applied to SSL without applying Vread during the bit line setup operation.

The bit line setup operation is executed simultaneously with the channel pre-charge operation in the bit line setup interval. In the following (N+1)th program loop, the bit line setup, program recovery and verify read intervals 2620, 2624 and 2626, respectively, are substantially the same as the Nth intervals 2610, 2614 and 2616, respectively, so duplicate description may be omitted. The (N+1)th program execute interval 2622 differs from the Nth program execute interval in that the voltage Vpgm+ΔVispp is applied to the selected word line towards the end of the interval instead of the voltage Vpgm. Subsequent (N+M)th program execute intervals differ from the Nth program execute interval in that the voltage Vpgm+MΔVispp is applied to the selected word line towards the end of the interval instead of the voltage Vpgm. In the Nth and subsequent program loops, a hybrid interval 2634 highlights the SSL remaining at Vcc throughout the program execute interval. Thus, the SSL remains at Vcc in the hybrid interval 2634.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

What is claimed is:

1. A method of programming a flash memory device, the method comprising:
   executing a bit line setup operation; and
   executing a channel pre-charge operation simultaneously with the bit line setup operation, the channel pre-charge operation comprising applying a channel pre-charge voltage to all word lines, applying the channel pre-charge voltage to a string selection line and applying a ground potential to the string selection line.

2. The method of claim 1 wherein the channel pre-charge voltage is the minimum voltage required to turn on a plurality of memory cells of the flash memory device.

3. The method of claim 1 wherein the channel pre-charge voltage is a read voltage greater than or equal to the minimum voltage required to turn on a plurality of memory cells of the flash memory device.

4. The method of claim 1, further comprising applying a supply voltage to the string selection line after the channel pre-charge operation.

5. The method of claim 1, the device comprising NAND flash memory cells.

6. The method of claim 1, the device comprising multi-level flash memory cells.

7. The method of claim 1, further comprising programming at least one memory cell using incremental step pulse programming (ISPP).

8. The method of claim 1, further comprising enabling cells to be passed by applying a pass voltage to all word lines and a supply voltage to the string selection line after the channel pre-charge operation.

9. The method of claim 1, further comprising enabling cells to be programmed by applying a program voltage to at least one selected word line.

10. The method of claim 1, further comprising recovering from programming by applying a low or ground voltage to all word lines, and the string selection line.

11. The method of claim 1, further comprising verifying programming by reading programmed cells.

12. The method of claim 1, further comprising performing a verify read operation directly before performing the bit line setup operation.

13. A flash memory device comprising:
- a voltage generator disposed for providing each of a program voltage, a pass voltage, and a channel pre-charge voltage;
- a high-voltage switch connected to the voltage generator and disposed for switchably providing one of the program voltage, pass voltage, or channel pre-charge voltage; and
- control logic connected to the high-voltage switch and disposed for simultaneously executing a bit line setup operation and a channel pre-charge operation, wherein in the channel pre-charge operation, the control logic controls the high-voltage switch to apply the channel pre-charge voltage to both selected and unselected word lines of the device and apply the channel pre-charge voltage to a string selection line of the device and, also in the channel pre-charge operation, the control logic applies a ground potential to the string selection line.

14. The device of claim 13 wherein the channel pre-charge voltage is the minimum voltage required to turn on a plurality of memory cells of the flash memory device.

15. The device of claim 13 wherein the channel pre-charge voltage is a read voltage greater than or equal to the minimum voltage required to turn on a plurality of memory cells of the flash memory device.

16. The device of claim 13, further comprising a plurality of NAND flash memory cells.

17. The device of claim 13, further comprising a plurality of multi-level flash memory cells.

18. The device of claim 13, at least one of the control logic or high-voltage generator further comprising an incremental step pulse programming (ISPP) unit disposed for programming at least one memory cell using ISPP.

19. The device of claim 13 wherein the control logic is further disposed for enabling cells to be passed by applying the pass voltage to all word lines and a supply voltage to the string selection line after the channel pre-charge operation.

20. The device of claim 13 wherein the control logic is further disposed for enabling cells to be programmed by applying the program voltage to at least one selected word line.

21. The device of claim 13 wherein the control logic is further disposed for recovering from programming by applying a low or ground voltage to all word lines and to the string selection line.

22. The device of claim 13 wherein the control logic is further disposed for verifying programming by reading programmed cells.

23. The device of claim 13 wherein the control logic is further disposed for executing the bit line setup operation directly after performing a verify read operation.

24. A flash memory system comprising:
- a flash memory controller; and
- a flash memory unit connected to the flash memory controller, the flash memory unit including a voltage generator disposed for providing each of a program voltage, a pass voltage, and a channel pre-charge voltage, a high-voltage switch connected to the voltage generator and disposed for switchably providing one of the program voltage, pass voltage, or channel pre-charge voltage, and control logic connected to the high-voltage switch and disposed for simultaneously executing a bit line setup operation and a channel pre-charge operation, wherein in the channel pre-charge operation, the control logic controls the high-voltage switch to apply the channel pre-charge voltage to both selected and unselected word lines of the unit and apply the channel pre-charge to a string selection line of the unit and, also in the channel pre-charge operation, the control logic applies a ground potential to the string selection line.

25. A method of incremental step pulse programming a flash memory device, the method comprising:
- performing a first program loop; and
- performing a second program loop after the first program loop,
- wherein each of the first and second program loops includes a bit line setup interval, a program execute interval, a program recovery interval and a verify read interval in sequence, and
- wherein the bit line setup interval includes a simultaneously occurring channel pre-charge operation, the channel pre-charge operation comprising applying a channel pre-charge voltage to all word lines, applying the channel pre-charge voltage to a string selection line and applying a ground potential to the string selection line.

* * * * *